(12) United States Patent
Matsumoto

(10) Patent No.: US 9,054,719 B2
(45) Date of Patent: Jun. 9, 2015

(54) CURRENT COMPENSATION CIRCUIT

(71) Applicant: ADVANTEST CORPORATION, Tokyo (JP)

(72) Inventor: Jun'ichi Matsumoto, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/206,163

(22) Filed: Mar. 12, 2014

(65) Prior Publication Data
US 2014/0285367 A1    Sep. 25, 2014

(30) Foreign Application Priority Data

Mar. 21, 2013 (JP) ................................. 2013-058970

(51) Int. Cl.
*H03M 9/00* (2006.01)
*H04L 7/00* (2006.01)
*G01R 31/319* (2006.01)
*H03K 3/015* (2006.01)

(52) U.S. Cl.
CPC .......... *H03M 9/00* (2013.01); *G01R 31/31922* (2013.01); *H03K 3/015* (2013.01); *H04L 7/00* (2013.01)

(58) Field of Classification Search
None
See application file for complete search history.

(56) References Cited

U.S. PATENT DOCUMENTS

| 7,509,517 | B2 * | 3/2009 | Matsumoto et al. | .......... 713/600 |
| 7,782,064 | B2 * | 8/2010 | Matsumoto et al. | .......... 324/555 |
| 8,555,098 | B2 * | 10/2013 | Fujibe et al. | ................... 713/323 |
| 2012/0086462 | A1 * | 4/2012 | Ishida | ........................... 324/601 |

FOREIGN PATENT DOCUMENTS

| KR | 10-2008-0055900 | 6/2008 |
| KR | 10-2011-0005264 | 1/2011 |

OTHER PUBLICATIONS

Office action dated Mar. 27, 2015 from corresponding Korean Patent Application No. 10-2014-0031565 and its English translation.

* cited by examiner

*Primary Examiner* — Howard Williams
(74) *Attorney, Agent, or Firm* — Ladas & Parry, LLP

(57) ABSTRACT

A first circuit operates in synchronization with a first clock having a first frequency, and generates N parallel data sets for every cycle period of the first clock. An interface circuit time-division multiplexes the N data sets received from the first circuit. A second circuit processes the N data set thus time-division multiplexed, in synchronization with a second clock having a second frequency which is N times the first frequency. A judgment unit judges whether or not the N data sets are effective data which instructs a flip-flop group, configured as a state holding element included in the second circuit, to generate an effective state transition. In a cycle period in which the N data sets are ineffective, a data replacement unit replaces at least a part of the N data sets with current compensation data $D_{CMP}$.

13 Claims, 7 Drawing Sheets

CURRENT COMPENSATION CIRCUIT

CROSS REFERENCE TO RELATED APPLICATIONS

This application claims priority from Japanese Application No. 2013-058970, filed on Mar. 21, 2013, the disclosure of which is incorporated herein by reference in its entirety.

BACKGROUND OF THE INVENTION

1. Field of the Invention

The present invention relates to a semiconductor device.

2. Description of the Related Art

In order to supply a test pattern to a device under test (DUT) to be tested, so as to test its operation and to judge the quality of the DUT, a test apparatus is employed. Such a test apparatus mounts: a pattern generator (PG) which generates a test pattern to be supplied to the DUT; and a timing generator (TG) which determines a timing at which the test pattern is supplied to the DUT. The period (frequency) of the test pattern is also referred to as the "test rate". The test apparatus is required to have a function whereby the test rate is changed as desired.

Typical timing generators each include analog or digital delay circuits. With such an arrangement, the delay provided by the variable delay circuit is set according to the test rate. That is to say, such an arrangement delays the test pattern itself, thereby providing a desired test rate.

Alternatively, by means of the variable delay circuit, such an arrangement applies a desired delay to a set signal or otherwise a reset signal which determines the transition timing of the test pattern. With such an arrangement, the test pattern is switched in synchronization with the set signal or reset signal thus delayed.

In recent years, the operating speed of semiconductor devices has been steadily increasing. The increased device operating speed requires the test rate to be improved. In the near future, such a test apparatus will be required to have a function of controlling the test rate with a very high resolution on the order of sub-picoseconds. Thus, the delay circuit employed in the timing generator is required to have a precision that is maintained at high level.

Here, the delay time provided by the delay circuit is affected by the operating current, the temperature, or the power supply voltage. Thus, in order to configure such a timing generator having high precision, the power supply voltage and the temperature are preferably maintained for the overall configuration of the IC (Integrated Circuit) chip including the delay circuit.

FIG. 1 is a diagram showing a configuration of a semiconductor device 1002 according to a comparison technique.

The semiconductor device 1002 includes a circuit block 1030 including multiple flip-flops or latches (which will be referred to as the "flip-flops") 1032. The flip-flops 1032 intermittently and repeatedly switch the state between (i) an operating state in which state transitions are generated in synchronization with a clock CLK, which requires current consumption; and (ii) a stopped state in which the state transitions are stopped, which requires substantially no operating current.

With such an arrangement, the duty ratio (time ratio) between the operating state and the stopped state depends on the pattern of the input signal $S_{IN}$ supplied to the circuit block 1030. Thus, the operating current $I_{DD}$ of the circuit block changes with the passage of time.

With such an arrangement, the change in the operating current $I_{DD}$ of the circuit block 1030 leads to a change in the surrounding temperature and/or a change in the power supply voltage $V_{DD}$. The change in the temperature or in the power supply voltage $V_{DD}$ has effects on the operations of other circuit blocks included in the test apparatus, examples of which include a pattern generator which generates a pattern to be supplied to the DUT, and a timing generator configured to control the pattern transition timing. This leads to a problem of jitter being superimposed on the generated signal.

In order to solve such a problem, a technique has been proposed in which a heater circuit 1040 (which is also referred to as a "load balance circuit") is connected in parallel with the circuit block 1030. With such a technique, the heater circuit 1040 is controlled such that the sum total of the operating current $I_{DD}$ of the circuit block 1030 and the consumed current (which will also be referred to as the "compensation current") $I_{CMP}$ provided by the heater circuit 1040 is maintained at a constant level.

The operating current $I_{DD}$ of the circuit block 1030 changes according to process variation. In order to solve such a problem, the heater circuit 1040 is configured to be capable of adjusting the amount of compensation current $I_{CMP}$ so as to cancel out the effect of the process variation. Specifically, the heater circuit 1040 includes multiple heater cells 1042 arranged in parallel with the circuit block 1030. The heater circuit 1040 is configured to be capable of controlling the compensation current $I_{CMP}$ according to the number of heater cells which are turned on.

Typically, with regard to process variation, there is a correlation between the operating current $I_{DD}$ of the circuit block 1030 and the delay amount provided by a delay element (not shown) built into the circuit block 1030. Thus, a method is employed in which the operating current $I_{DD}$ of the circuit block 1030 is estimated based on the delay amount provided by the delay circuit built into the circuit block 1030. More specifically, the operating current $I_{DD}$ of the circuit block 1030 is estimated by estimating the oscillation period of an oscillator having a circuit loop including the delay circuit. The number of heater cells being in ON state of the heater circuit 1040 is determined based on the operating current $I_{DD}$ thus estimated.

With such a current compensation technique employing the heater circuit 1040, such an arrangement requires the heater circuit 1040 in addition to the circuit block 1030. This leads to a problem of an increase in the circuit scale.

In particular, if the fluctuation range of the operating current $I_{DD}$ of the circuit block 1030 becomes greater, there is a need to increase the range of the compensation current $I_{CMP}$ to be generated by the heater circuit 1040. Thus, in order to provide high-precision current compensation, there is a need for an explosive increase in the circuit scale of the heater circuit 1040, which is a problem.

In addition, in a case in which there is a small correlation between the operating current $I_{DD}$ and the delay amount provided by the delay element built into the circuit block 1030, this leads to an increase in the error between the estimated value of the operating current $I_{DD}$ and the actual value. This leads to a problem in that the sum total of the operating current $I_{DD}$ and the compensation current $I_{CMP}$ cannot be maintained at a constant level in the operation of the heater circuit 1040.

The aforementioned problems are not restricted to such a timing generator. Rather, such problems can occur in various kinds of semiconductor devices.

SUMMARY OF THE INVENTION

The present invention has been made in view of such a situation. Accordingly, it is an exemplary purpose of the present invention to provide a semiconductor device which provides high-precision current compensation while having a small circuit scale.

An embodiment of the present invention relates to a current compensation circuit. The current compensation circuit is configured to receive N parallel data sets for every cycle period of a first clock from a first circuit configured to operate in synchronization with the first clock having a first frequency and to output the N data sets thus received to a second circuit configured as a downstream stage. The current compensation circuit comprises: a judgment unit configured to judge, for every cycle period, whether or not the N data sets are effective data which instructs at least one state holding element included in the second circuit to generate an effective state transition; and a data replacement unit configured such that, in a cycle period in which judgment has been made that the N data sets are ineffective, at least a part of the N data sets is replaced by current compensation data so as to instruct at least one state holding element included in the second circuit to generate an effective state transition.

With such an embodiment, in a cycle period in which the operating current of the second circuit according to the original data set is substantially zero, the current compensation data is applied so as to cause a state transition to occur in the state holding element, i.e., a latch circuit, flip-flop, or the like, thereby instructing the second circuit itself to generate a compensation current. Such an arrangement is capable of suppressing fluctuation in the operating current of the second circuit regardless of the contents of the N data sets.

Such a configuration does not require an additional heater circuit in addition to the second circuit, thereby suppressing an increase in the circuit scale. Furthermore, such an arrangement is capable of setting the amount of compensation current generated by the second circuit according to the current compensation data, which is another advantage. In addition, the second circuit, which is configured as a compensation target circuit, is itself also configured as a compensation circuit configured to generate the compensation current. Thus, the compensation circuit and the compensation target circuit receive the same effects of process variation. Thus, there is no need to estimate the operating current of the second circuit in order to compensate for process variation, which is yet another advantage.

Also, a parallel/serial converter may be arranged between the current compensation circuit and the second circuit. Also, the second circuit may be configured to process, in synchronization with a second clock having a second frequency which is N times the first frequency, the N data sets time-division multiplexed by the parallel/serial converter. Also, the parallel/serial converter may be configured such that (i) in a cycle period in which judgment has been made that the N data sets are effective, the N data sets are time-division multiplexed, and the multiplexed data is supplied to the second circuit, and such that (ii) in a cycle period in which judgment has been made that the N data sets are ineffective, the N data sets are time-division multiplexed after data replacement is performed, and the multiplexed data is supplied to the second circuit.

Another embodiment of the present invention relates to a semiconductor device. The semiconductor device comprises: a first circuit configured to operate in synchronization with a first clock having a first frequency, and to generate N parallel data sets for every cycle period of the first clock; an interface circuit configured to time-division multiplex the N data sets received from the first circuit; and a second circuit configured to process, in synchronization with a second clock having a second frequency which is N times the first frequency, the N data sets time-division multiplexed by the interface circuit. The interface circuit comprises: a judgment unit configured to judge, for every cycle period, whether or not the N data sets are effective data which instructs at least one state holding element included in the second circuit to generate an effective state transition; a data replacement unit configured such that, in a cycle period in which judgment has been made that the N data sets are ineffective, at least a part of the N data sets is replaced by current compensation data which instructs at least one state holding element included in the second circuit to generate an effective state transition; and a parallel/serial converter configured such that (i) in a cycle period in which judgment has been made that the N data sets are effective, the N data sets are time-division multiplexed, and the multiplexed data is supplied to the second circuit, and such that (ii) in a cycle period in which judgment has been made that the N data sets are ineffective, the data sets subjected to data replacement are time-division multiplexed, and the multiplexed data is supplied to the second circuit.

With such an embodiment, in a cycle period in which the operating current of the second circuit according to the original data set is substantially zero, the current compensation data is applied so as to instruct the state holding element included in the second circuit to generate a state transition. Thus, such an arrangement allows the second circuit itself to generate the compensation data. Such an arrangement is capable of suppressing fluctuation in the operating current of the second circuit regardless of the contents of the N data sets.

Such a configuration does not require an additional heater circuit in addition to the second circuit, thereby suppressing an increase in the circuit scale. Furthermore, such an arrangement is capable of setting the amount of compensation current generated by the second circuit according to the current compensation data, which is another advantage. In addition, the second circuit, which is configured as a compensation target circuit, is itself also configured as a compensation circuit configured to generate the compensation current. Thus, the compensation circuit and the compensation target circuit receive the same effects of process variation. Thus, there is no need to estimate the operating current of the second circuit in order to compensate for process variation, which is yet another advantage.

With the average value of an operating current that flows through at least one state holding element according to the N effective data sets as $I_{DD\_AVE}$, the current compensation data may be determined such that a compensation current $I_{CMP}$ that flows through the at least one state element becomes substantially equal to the average value $I_{DD\_AVE}$.

Such an arrangement is capable of suppressing fluctuation in the operating current of the second circuit that occurs due to transition between a cycle in which the N data sets are effective and a cycle in which the N data sets are ineffective.

With the average value of the number of times state transitions occur in at least one state holding element according to the N effective data sets as X, the current compensation data may be determined such that the number of times state transitions occur in the aforementioned at least one state holding element becomes approximately X.

Also, the N data sets may each include an enable bit having a correlation with whether or not a state transition occurs in the at least one state holding element. Also, the enable bits of the N data sets are all negated, the judgment unit may judge that the N data sets are ineffective.

Yet another embodiment of the present invention relates to a timing generator employed in a semiconductor test apparatus, and configured to generate a timing signal having a phase which is adjustable for every predetermined reference period.

The timing generator comprises: a data generating unit configured to output, in a parallel manner in synchronization with a first clock having a period that is N times the reference period, (i) N enable data configured to respectively indicate whether or not the timing signal is to be generated in the N sequential reference periods, and (ii) N delay setting data configured to respectively indicate the phase of the timing signal to be generated in the N sequential reference periods; an interface circuit configured to time-division multiplex the N enable data and the N delay setting data received from the data generating unit; and a pulse generator configured to receive a set of the enable data and the delay setting data for every reference period, and to apply a delay that corresponds to the delay setting data to a second clock having the same period as that of the reference period in the reference period in which the enable data is asserted, so as to generate the timing signal. The interface circuit comprises: a judgment unit configured to assert a judgment signal when the N enable data are all negated; and a data replacement unit configured such that (i) in a cycle in which the judgment signal is negated, the N enable data and the N delay setting data are time-division multiplexed and the multiplexed data is supplied to the pulse generator, and such that (ii) in a cycle in which the judgment signal is asserted, at least a part of the N delay setting data is replaced by current compensation data configured to instruct at least one state holding element included in the pulse generator to generate an effective state transition, the N enable data and the N current compensation data are time-division multiplexed, and the multiplexed data is supplied to the pulse generator.

With such an embodiment, when the enable data is negated throughout the N sequential reference periods, judgment is made that the operating current of the pulse generator becomes substantially zero in that cycle. In such a cycle in which judgment has been made that the operating current of the pulse generator is very small, the current compensation data is applied so as to instruct at least one state holding element to generate a state transition. Thus, such an arrangement allows the pulse generator itself to generate the compensation current. Such an arrangement is capable of suppressing fluctuation in the operating current of the pulse generator regardless of the pattern of the enable data and the delay setting data. Typically, if the operating current of the pulse generator fluctuates, this leads to the occurrence of jitter in the timing signal. However, such an embodiment suppresses the occurrence of jitter.

Such a configuration does not require an additional heater circuit in addition to the pulse generator, thereby suppressing an increase in the circuit scale. Furthermore, such an arrangement is capable of setting the amount of compensation current generated by the pulse generator according to the current compensation data, which is another advantage. In addition, the pulse generator, which is configured as a compensation target circuit, is itself also configured as a compensation circuit configured to generate the compensation current. Thus, the compensation circuit and the compensation target circuit receive the same effects of process variation. Thus, there is no need to estimate the operating current of the pulse generator in order to compensate for process variation, which is yet another advantage.

With the average value of an operating current that flows through the aforementioned at least one state holding element according to the N effective delay setting data sets as $I_{DD\_AVE}$, the current compensation data may be determined such that an amount of a compensation current $I_{CMP}$ that flows through the aforementioned at least one state holding element is substantially equal to the average value $I_{DD\_AVE}$.

Such an arrangement is capable of suppressing fluctuation in the operating current of the pulse generator that occurs due to transition between a cycle in which the N data sets are effective and a cycle in which the N data sets are ineffective.

With the average value of the number of times state transitions occur in at least one state holding element included in the second circuit according to the N delay setting data in a cycle in which the judgment signal is asserted as X, the current compensation data may be determined such that the number of times state transitions occur in the aforementioned at least one state holding element according to the current compensation data is approximately X.

This allows the fluctuation of the operating current of the pulse generator to be markedly reduced.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
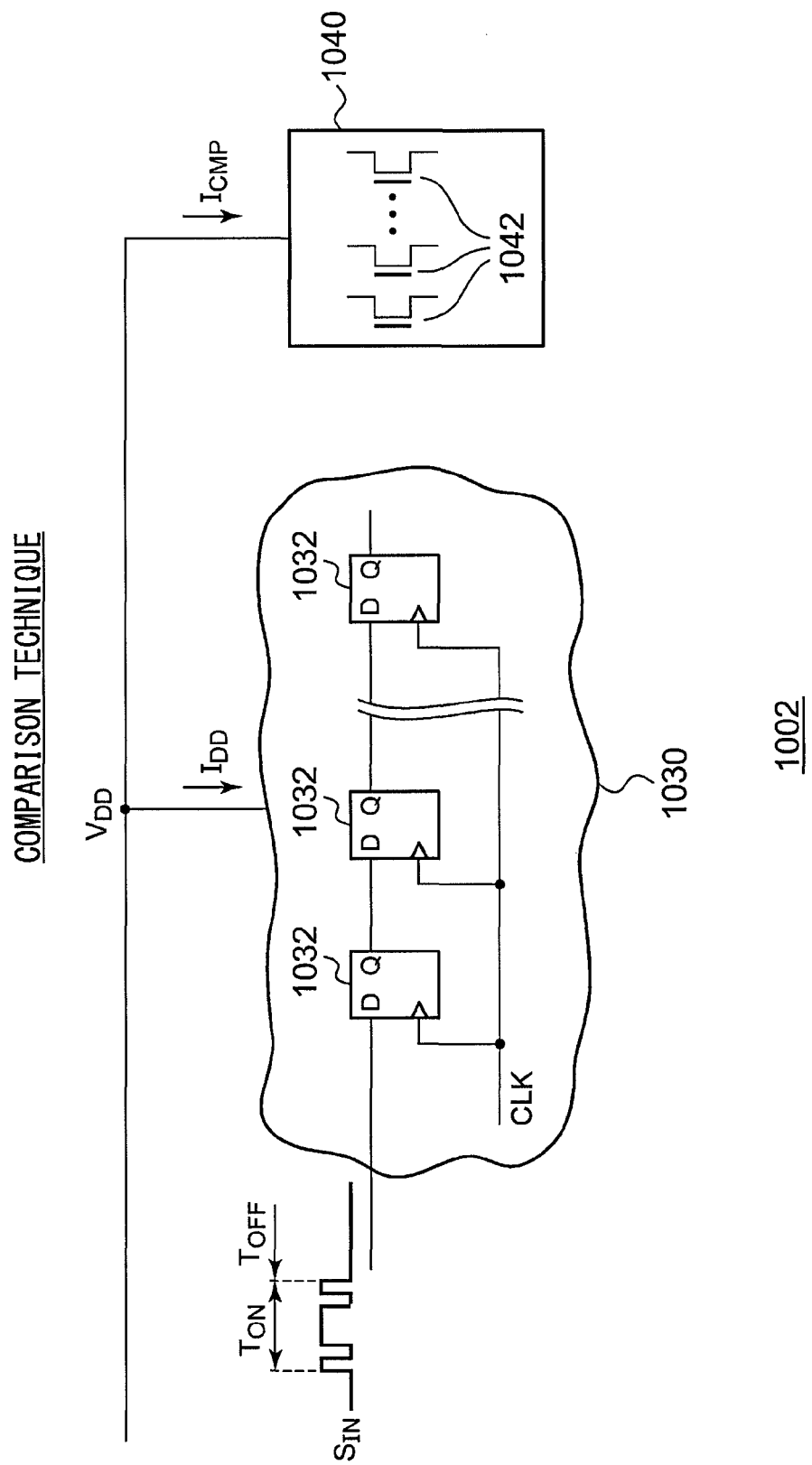
FIG. 1 is a diagram showing a configuration of a semiconductor device according to a comparison technique.
Figure 2:
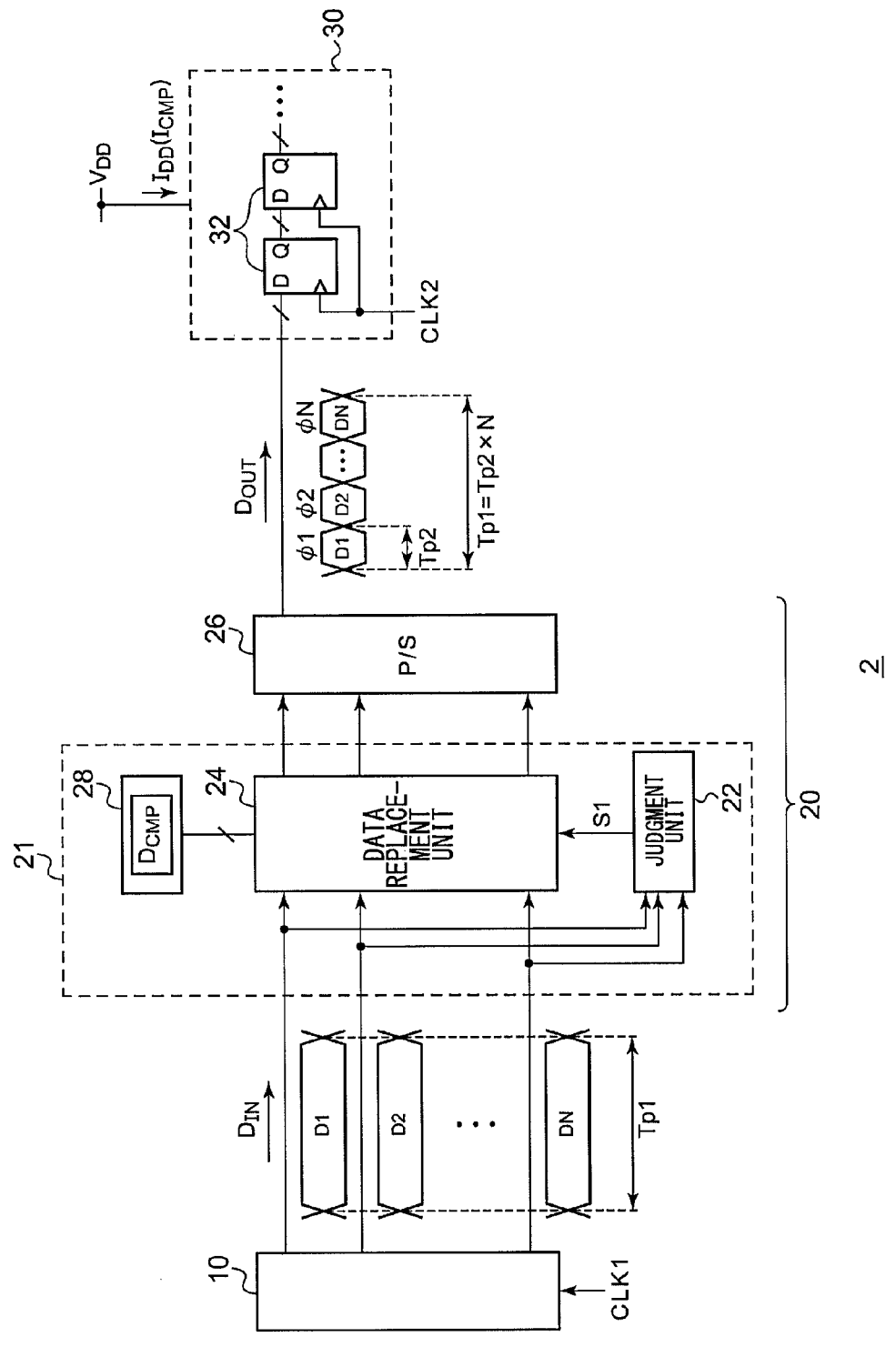
FIG. 2 is a block diagram showing a configuration of a semiconductor device according to an embodiment.

FIG. 2 is a block diagram showing a configuration of a semiconductor device 2 according to an embodiment. The semiconductor device 2 includes a first circuit 10, a current compensation circuit 21, a parallel/serial converter (data serializer) 26, and a second circuit 30.

The first circuit 10 generates N parallel data sets D1 through DN for every cycle period Tp1 (=1/f1) of the first clock CLK1 in synchronization with a first clock CLK1 having a first frequency f1. The data sets D1 through DN of the data each include multiple bits.

The parallel/serial converter 26 receives N data sets (input data $D_{IN}$) from the first circuit 10 via the current compensation circuit 21 as described later. The parallel/serial converter 26 time-division multiplexes the received N data sets. Specifically, the parallel/serial converter 26 divides the cycle period Tp1 into N phases along the time axis. Furthermore, the parallel/serial converter 26 sequentially arranges the N data sets D1 through DN on the first phase φ1 through the N-th phase φN, respectively, so as to generate output data $D_{OUT}$. The length of the respective phases φ1 through φ4 are each set to the same length Tp2 represented by Tp1/N.

In synchronization with a second clock CLK2, the second circuit 30 processes the N data sets D1 through DN thus time-division multiplexed by the parallel/serial converter 26. The second clock CLK2 is configured to have a second frequency f2 that is N times the frequency of the first clock CLK1. It should be noted that the processing provided by the second circuit 30 is not restricted in particular.

The second circuit 30 includes, as built-in components, multiple state holding elements (which will be referred to as "flip-flops" hereafter) 32 such as flip-flops, latches, or the like. The flip-flops 32 latch the data sets D1 through DN received from the parallel/serial converter 26, in synchronization with the second clock CLK2. The operating current (which will also be referred to as "consumed current" or "power supply current") $I_{DD}$ of the second circuit 30 occurs according to the state transition of the flip-flop group 32 configured as an internal component. For every cycle period Tp1, the amount of operating current $I_{DD}$ depends on the N data sets D1 through DN received from the parallel/serial converter 26.

That is to say, for every cycle period Tp1, the N data sets D1 through DN each have a different set of values. Specifically, when a data set having a certain set of values passes through the flip-flop group 32, the operating current $I_{DD}$ thereof is increased. When a data set having a different set of values passes through the flip-flop group 32, the operating current $I_{DD}$ thereof is reduced. When a data set having a further different set of values passes through the flip-flop group 32, the operating current $I_{DD}$ thereof becomes substantially zero.

In the present embodiment, in a case in which, when the data sets D1 through DN are supplied to the flip-flop group 32 of the second circuit 30, and an operating current $I_{DD}$ having a significant value does not occur, i.e., the operating current $I_{DD}$ is substantially zero, the data sets D1 through DN will be referred to as "ineffective data". On the other hand, in a case in which, when the data sets D1 through DN are supplied to the flip-flop group 32 of the second circuit 30, and an operating current $I_{DD}$ having a significant value (i.e., having a non-zero value) occurs, the data sets D1 through DN will be referred to as "effective data" hereafter.

That is to say, the operating current $I_{DD}$ of the second circuit 30 becomes great in a cycle period Tp1 in which the data sets D1 through DN are effective. On the other hand, the operating current $I_{DD}$ of the second circuit 30 becomes substantially zero in a cycle period Tp1 in which the data sets D1 through DN are ineffective.

With the present embodiment, in order to suppress fluctuation of the operating current of the second circuit 30, the current compensation circuit 21 is arranged between the first circuit 10 and the second circuit 30, and specifically, is arranged as an upstream stage of the parallel/serial converter 26. The current compensation circuit 21 instructs the second circuit 30 to operate as a compensation circuit configured to generate a compensation current $I_{CMP}$ during a cycle period in which the data sets D1 through DN are ineffective. The current compensation circuit 21 and the parallel/serial converter 26 can be regarded as an interface circuit 20 configured to control the data transmission from the first circuit 10 to the second circuit 30. Description will be made below regarding a specific configuration of the current compensation circuit 21.

The current compensation circuit 21 includes a judgment unit 22, a data replacement unit 24, and data memory 28.

The judgment unit 22 checks the N data sets D1 through DN for every cycle period Tp1, and judges whether the N data sets D1 through DN are effective data or ineffective data. The judgment unit 22 generates a judgment signal S1 which is asserted (e.g., set to high level) in a cycle (ineffective cycle) in which the N data sets D1 through DN are ineffective data, and which is negated (e.g., set to low level) in a cycle (effective cycle) in which the N data sets D1 through DN are effective data.

When judgment has been made that a cycle period is an ineffective cycle in which the N data sets D1 through DN are ineffective, the data replacement unit 24 replaces at least a part of the N data sets D1 through DN with current compensation data $D_{CMP}$. The current compensation data $D_{CMP}$ is determined so as to instruct the flip-flop group 32 included in the second circuit 30 to generate an effective state transition, i.e., so as to instruct the second circuit 30 to generate a desired compensation current $I_{CMP}$.

When judgment has been made that (i) the cycle period is an effective cycle in which the N data sets D1 through DN are effective data, the parallel/serial converter 26 time-division multiplexes the N data sets D1 through DN, and supplies the data sets thus multiplexed to the second circuit 30. When judgment has been made that (ii) the cycle period is an ineffective cycle in which the N data sets D1 through DN are ineffective data, the parallel/serial converter 26 time-division multiplexes the N data sets D1 through DN after the data replacement, and supplies the data sets thus multiplexed to the second circuit 30.

For example, the current compensation data $D_{CMP}$ is configured to have a predetermined pattern, and is stored in the data memory 28.

The average value of the operating current $I_{DD}$ that flows through the second circuit 30 according to the N effective data sets D1 through DN supplied to the flip-flop group 32 will be represented by $I_{DD\_AVE}$ hereafter. The current compensation data $D_{CMP}$ is preferably determined such that the compensation current $I_{CMP}$ that flows through the flip-flop group 32 is substantially equal to the average value $I_{DD\_AVE}$.

Let us say that the set of values of the N data sets D1 through DN can each be set to any one of M sets of values, i.e., a first set of values through an M-th set of values. The operating current flows through the second circuit 30 according to the set of values thus set, which will be represented by a corresponding one from among $I_{DD1}$ through $I_{DDM}$. Furthermore, the probability of the set of values being set to the first set of values through the probability of the set of values being set to the M-th set of values will be represented by P1 through PM, respectively. In this case, the average value $I_{DD\_AVE}$ of the operating current $I_{DD}$ is represented by the following Expression.

$$I_{DD\_AVE} = P1 \times I_{DD1} + P2 \times I_{DD2} + \ldots + PM \times I_{DDM}$$

In particular, in a case in which the probabilities P1 through PM are the same, the following Expression holds true.

$$I_{DD\_AVE}(\Sigma_{k=1:M}I_{DDk})/M$$

Thus, in a case in which the operating currents $I_{DD1}$ through $I_{DDM}$ that flow through the second circuit 30, and the probabilities P1 through PM, are known, the average value $I_{DD\_AVE}$ can be calculated. Thus, the current compensation data $D_{CMP}$ can be calculated beforehand so as to generate the compensation current $I_{CMP}$ having a value that is substantially equal to the average value $I_{DD\_AVE}$.

Alternatively, the current compensation data $D_{CMP}$ may be calculated in real time based on the data set D1 through DN supplied from the first circuit 10.

There is a correlation between the operating current $I_{DD}$ of the second circuit 30 in a given cycle period Tp1 and the number of times state transitions occur in the flip-flop group 32 included in the second circuit 30. Thus, with the average value of the number of times state transitions occur in the flip-flop group 32 according to the N effective data sets D1 through DN as X, the current compensation data $D_{CMP}$ may be determined such that the number of times state transitions occur in the flip-flop group 32 becomes approximately X.

With an embodiment, the N data sets D1 through DN may each include an enable bit EN which has a correlation with the occurrence of a state transition in the flip-flop group 32, and other bits (which will collectively be referred to as a "data bit"). For example, when the operating current $I_{DD}$ of the second circuit 30 becomes substantially zero in the i-th phase in which the data set Di passes through the second circuit 30, the enable bit EN of the i-th data set Di is negated (set to 0). When the operating current $I_{DD}$ having a significant value flows through the second circuit 30 in the i-th phase, the enable bit EN is asserted (set to 1).

In this case, when the enable bits EN of the N data sets D1 through DN are all negated (set to low level), the judgment unit 22 may judge that the N data sets D1 through DN are ineffective.

The above is the configuration of the semiconductor device 2. Next, description will be made regarding the operation thereof.

Figure 3:
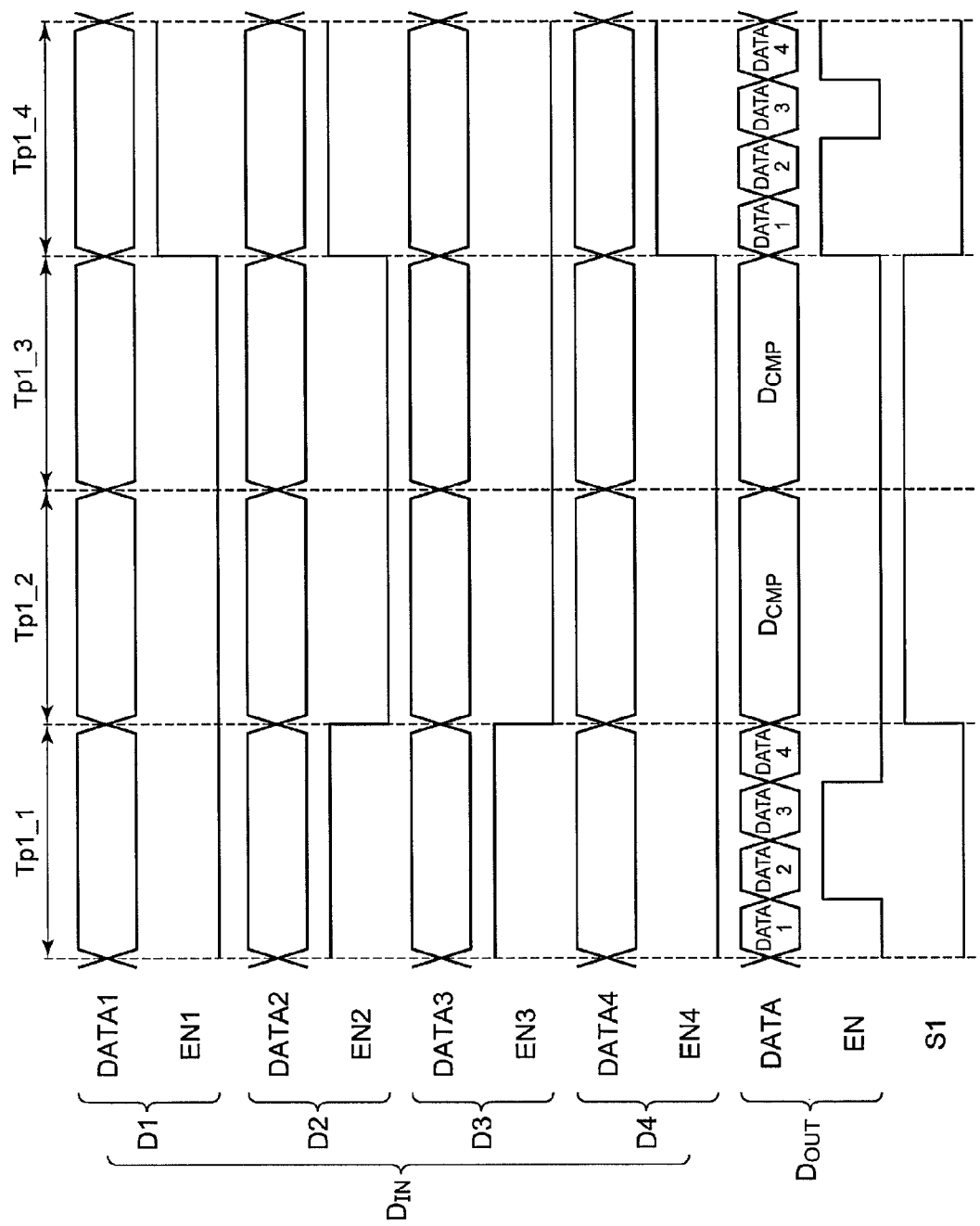
FIG. 3 is a time chart showing the operation of the semiconductor device shown in FIG. 2.

FIG. 3 is a time chart showing the operation of the semiconductor device 2 shown in FIG. 2. Description will be made below regarding an arrangement in which N=4. In the first cycle Tp1_1, the enable bit EN2 included in the second data set D2 and the enable bit EN3 included in the third data set D3 are each asserted. Thus, the judgment signal S1 is negated. As a result, the second circuit 30 is supplied with the data $D_{OUT}$ obtained by time-division multiplexing of the first data set D1 through the fourth data set D4.

In the second cycle Tp1_2 and the third cycle Tp1_3, the enable bits EN1 through EN4 of the data sets D1 through D4 are all negated, and the judgment signal S1 is asserted. As a result, the output data $D_{OUT}$ including the current compensation data $D_{CMP}$ is supplied to the second circuit 30.

In the fourth cycle Tp1_4, the enable bits EN1, EN2, and EN4, respectively included in the first data set D1, the second data set D2, and the fourth data set D4, are asserted. Thus, the judgment signal S1 is negated. As a result, the second circuit 30 is supplied with the data $D_{OUT}$ obtained by time-division multiplexing of the first data set D1 through the fourth data set D4.

The first cycle Tp1_1 and the fourth cycle Tp1_4 are each configured as an effective cycle. Thus, in these cycles, the operating current $I_{DD}$ flows through the second circuit 30 according to the first data set D1 through the fourth data set D4. In contrast, the second cycle Tp1_2 and the third cycle Tp1_3 are each configured as an ineffective cycle. Thus, after a part of the first data set D1 through the fourth data set D4 is replaced by the current compensation data $D_{CMP}$, the data sets are supplied to the second circuit 30. As a result, in the second cycle Tp1_2 and the third cycle Tp1_3, the compensation current $I_{CMP}$ flows according to the current compensation data $D_{CMP}$.

The above is the operation of the semiconductor device 2.

With the semiconductor device 2, in the cycle period Tp1 in which the operating current $I_{DD}$ of the second circuit which depends on the original data sets D1 through D4 becomes substantially zero, such an arrangement provides a state transition of the flip-flops 32 by means of the current consumption data $D_{CMP}$. This allows the second circuit 30 itself to generate the compensation current $I_{CMP}$. Such an arrangement is capable of suppressing fluctuation of the operating current $I_{DD}$ of the second circuit 30 regardless of the contents of the N data sets D1 through DN.

Such a configuration does not require a heater circuit in addition to the second circuit 30, thereby suppressing an increase in the circuit scale. Furthermore, such an arrangement is capable of setting the amount of the compensation current $I_{CMP}$ generated by the second circuit 30 according to the current compensation data $D_{CMP}$, which is another advantage. In addition, the second circuit 30, which is configured as a compensation target circuit, itself operates as a compensation circuit which generates the compensation current $I_{CMP}$. Accordingly, the compensation circuit and the compensation target circuit receive the same effects of process variation. Thus, such an arrangement does not require estimation of the operating current of the second circuit 30 for process variation compensation, which is yet another advantage.

Next, description will be made regarding the usage of the semiconductor device 2. The semiconductor device 2 may be employed in a timing generator 504 included in a semiconductor test apparatus 500, for example.

Figure 4:
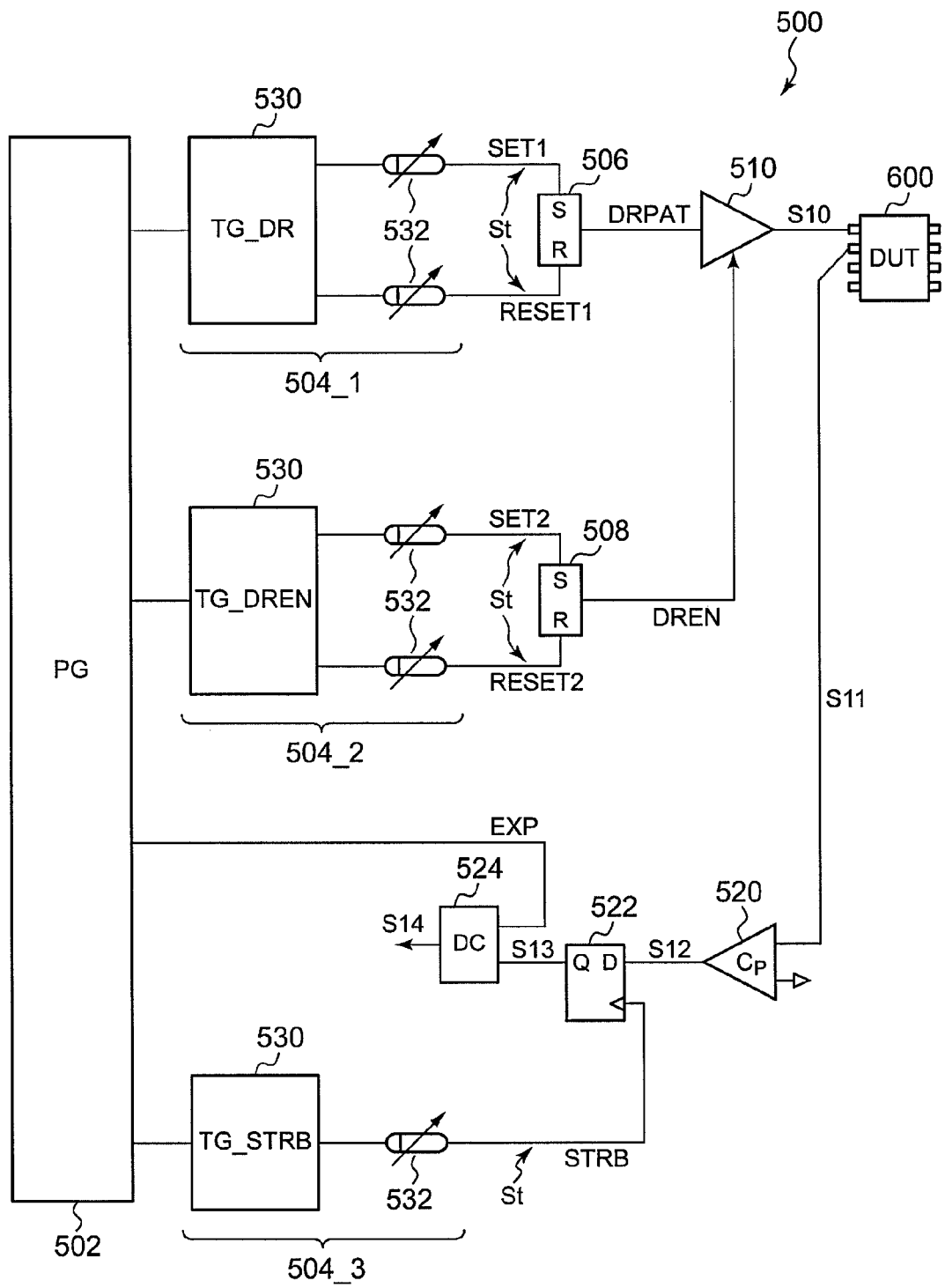
FIG. 4 is a block diagram showing a configuration of a semiconductor test apparatus.

FIG. 4 is a block diagram showing a configuration of the semiconductor test apparatus 500. The semiconductor test apparatus 500 includes a pattern generator 502, a timing generator 504, SR latches 506 and 508, a driver 510, a comparator 520, a timing comparator 522, and a digital comparator 524.

The driver 510 receives, as an input signal, a driver pattern signal DRPAT which is set to high level or otherwise low level for every predetermined rate period. The driver 510 generates a binary test pattern S10 according to the driver pattern signal DRPAT thus received, and supplies the test pattern S10 to a DUT 600. For every rate period, the driver 510 receives, as an input signal, a driver enable signal DREN which indicates whether or not the driver 510 is to be operated.

The DUT 600 generates a data output S11 according to the test pattern S10. The comparator 520 compares the data output S11 output from the DUT 600 with a threshold voltage $V_H/V_L$, and generates comparison data S12 which represents the level of the data output S11.

The timing comparator 522 latches the comparison data S12 at a timing of a strobe signal STRB. The digital comparator 524 compares an output S13 of the timing comparator 522 with expected value data EXP, and generates fail data S14 which represents the data matching result. The fail data S14 is written to unshown fail memory. The quality of the DUT 600 is judged based on the fail data S14. Alternatively, a defective part of the DUT 600 is identified based on the fail data S14.

The timing generator 504 is configured having multiple channels. The respective channels are configured to generate various kinds of timing signals St each having a phase which can be adjusted for every predetermined rate period. Specifically, the timing generator 504 includes a driver pattern control signal timing generator 504_1, a driver enable signal timing generator 504_2, and a strobe signal timing generator 504_3.

The timing generator 504_1, which is configured as the first channel, generates a set signal SET1 which indicates a positive edge of the test pattern S10 or otherwise a reset signal RESET1 which indicates a negative edge of the test pattern S10. The set signal SET1 is input to a set terminal of the SR latch 506. The reset signal RESET1 is input to a reset terminal of the SR latch 506. With such an arrangement, the driver pattern signal DRPAT is switched according to the set signal SET1 and the reset signal RESET1.

The timing generator 504_2, which is configured as the second channel, generates a set signal SET2 which indicates a positive edge of the driver enable signal DREN or otherwise a reset signal RESET2 which indicates a negative edge of the driver enable signal DREN. The set signal SET2 is input to a set terminal of the SR latch 508. The reset signal RESET2 is input to a reset terminal of the SR latch 508. With such an arrangement, the driver enable signal DREN is switched according to the set signal SET2 and the reset signal RESET2.

The timing generator 504_3, which is configured as the third channel, generates the strobe signal STRB as a timing signal St for every rate period.

The timing generators 504_1 through 504_3, which are configured as the respective channels, each include: a digital unit 530 which controls the phase of the timing signal St with low precision in a digital manner; and an analog unit 532 which controls the phase of the timing signal St with high precision in an analog manner. The digital unit 530 and the analog unit 532 each control the phase of the timing signal St according to the pattern data received from the pattern generator 502. The timing generator 504 of each channel may have the same configuration.

For example, assuming that the reference period Tp is set to 833 ps, the digital unit 530 adjusts the phase of the timing signal St with a precision of 833/4 ps=104 ps. Furthermore, the analog unit 532 adjusts the phase of the timing signal St with a precision that is finer than 104 ps.

Figure 5:
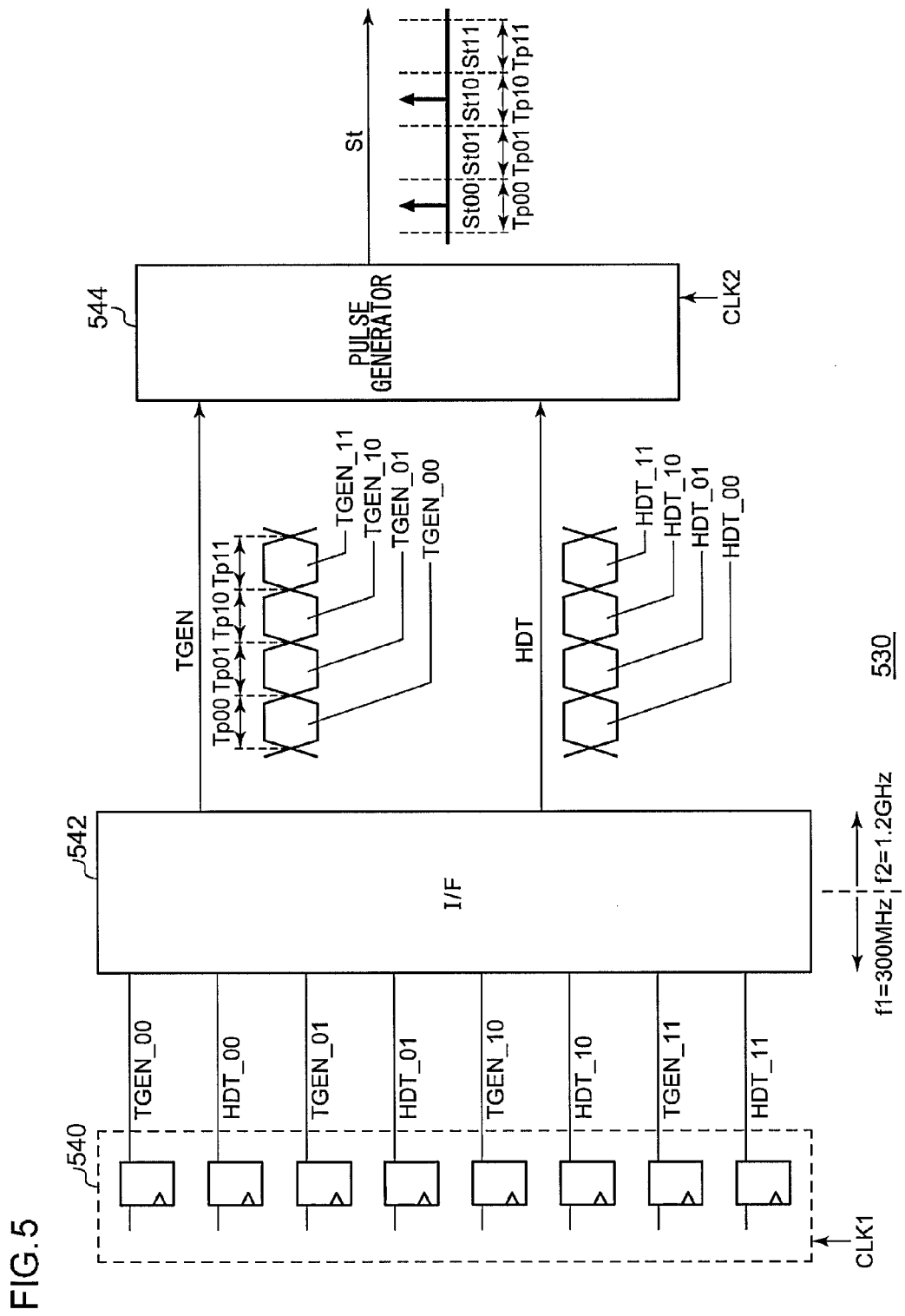
FIG. 5 is a circuit diagram showing a configuration of a digital unit of a timing generator.

The semiconductor device 2 shown in FIG. 2 may be suitably employed as a digital unit 530 included in the timing generator 504, for example. FIG. 5 is a circuit diagram showing a configuration of the digital unit 530 of the timing generator 504. FIG. 5 shows only a configuration of one of the channels.

The digital unit 530 of the timing generator 504 includes a data generating unit 540, a current compensation circuit 542, and a pulse generator 544.

The data generating unit 540 receives the pattern data from the pattern generator 502. The data generating unit 540 outputs N enable data TGEN_00, TGEN_01, TGEN_10, and TGEN_11, and N delay setting data HDT_00, HDT_01, HDT_10, and HDT_11, each of which indicates the phase of the timing signal St, in a parallel manner in synchronization with the first clock CLK1, which is N times (N=4 in the present embodiment) the reference period Tp. The data generating unit 540 corresponds to the first circuit 10 shown in FIG. 2.

The N enable data TGEN_00, TGEN_01, TGEN_10, and TGEN_11 indicate whether or not a timing signal St is to be generated for N sequential reference periods Tp00, Tp01, Tp10, and Tp11, respectively. For example, when TGEN_00=1, the timing signal St is generated for the first reference period Tp00. When TGEN_10=0, the timing signal St10 is not generated for the third reference period Tp10.

The N delay setting data HDT_00, HDT_01, HDT_10, and HDT_11 indicate the phases of the timing signals St00, St01, St10, and St11 for the N sequential reference periods Tp00, Tp01, Tp10, and Tp11, respectively.

The current compensation circuit 542 time-division multiplexes the N enable data TGEN_00, TGEN_01, TGEN_10, and TGEN_11, and the N delay setting data HDT_00, HDT_01, HDT_10, and HDT_11, which are received from the data generating unit 540. The current compensation circuit 542 corresponds to the interface circuit 20 shown in FIG. 2.

The pulse generator 544 operates in synchronization with the second clock CLK2 having the same period as the reference period Tp. The pulse generator 544 receives a set of the enable data TGEN and the delay setting data HDT for each of the reference periods Tp00, Tp01, Tp10, and Tp11. The pulse generator 544 corresponds to the second circuit 30 shown in FIG. 2.

When the enable data TGEN_i is asserted for the i-th reference period Tpi, the pulse generator 544 applies a delay $\tau\_i$ that corresponds to the delay setting data HDT_i to the second clock CLK2, so as to generate the timing signal St_i.

When the enable data TGEN_i is negated in the i-th reference period Tpi, the pulse generator 544 does not generate the timing signal St_i for the reference period Tpi.

Figure 6:
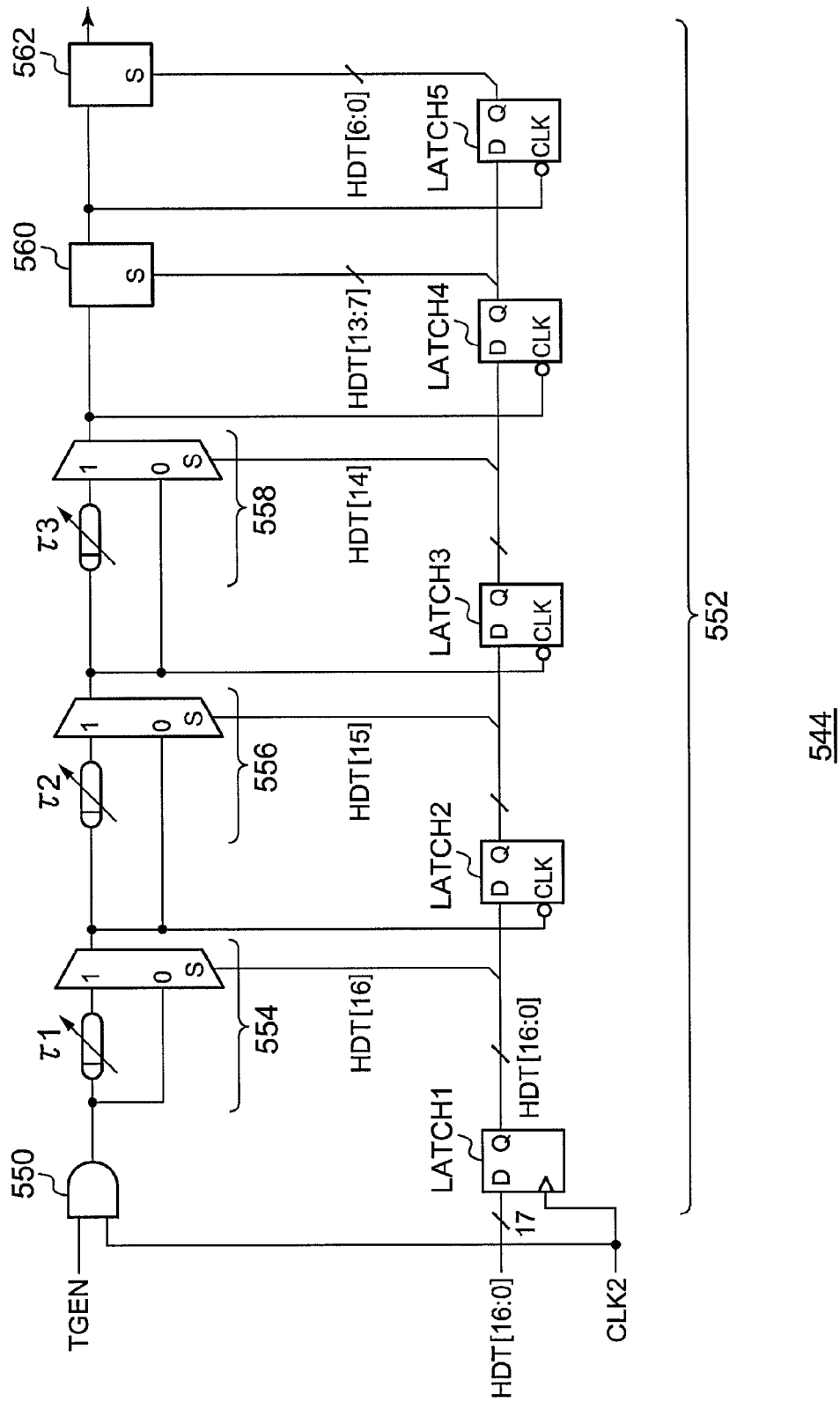
FIG. 6 is a circuit diagram showing an example configuration of a pulse generator.

FIG. 6 is a circuit diagram showing an example configuration of the pulse generator 544. For every reference period, an AND gate 550 masks the second clock CLK2 using the enable data TGEN. As a result, in a cycle in which the enable data TGEN is asserted (set to 1), the second clock CLK2 is supplied to a multi-stage delay circuit 552 configured as a downstream stage. In contrast, in a cycle in which the enable data TGEN is negated (set to 0), the second clock CLK2 is not supplied to the multi-stage delay circuit 552 configured as a downstream stage.

The multi-stage delay circuit 552 applies a delay that corresponds to the delay setting data HDT to the second clock CLK2.

For example, the delay setting data HDT is configured as 17-bit data, and is configured to apply, to the second clock CLK2, a delay $\tau$ that corresponds to the high-order bits HDT[16:14] of the delay setting data HDT. When the most significant bit HDT[16] of the delay setting data HDT is set to 1, a first delay unit 554 applies a delay amount $\tau 1$ (=416 ps), and when it is set to 0, the delay amount applied by the first delay unit 554 becomes zero. When the second-highest-order bit HDT[15] of the delay setting data HDT is set to 1, a second delay unit 556 applies a delay amount $\tau 2$ (=208 ps), and when it is set to 0, the delay amount applied by the second delay unit 556 becomes zero. When the third-highest-order bit HDT[14] of the delay setting data HDT is set to 1, a third delay unit 558 applies a delay amount $\tau 3$ (=104 ps), and when it is set to 0, the delay amount applied by the third delay unit 558 becomes zero.

The delay fine adjustment units 560 and 562 are arranged in order to correct variation that can occur in the delay units 554 through 558. The delay amount provided by the delay fine adjustment unit 560 is set according to the delay setting data HDT[13:7]. The delay amount provided by the delay fine adjustment unit 562 is set according to the delay setting data HDT[6:0].

With the pulse generator 544, the delay setting data HDT is transmitted via the multiple state holding elements LATCH1 through LATCH5. The state holding element LATCH1 is configured as an edge-triggered latch circuit, i.e., a D flip-flop, and configured to latch the delay setting data HDT[16:0] at an edge timing of the second clock CLK2.

The state holding elements LATCH2 through LATCH5 are each configured as a transparent latch, i.e., a D latch. The state holding elements LATCH2 through LATCH5 are each configured such that, when its clock terminal is asserted (set to high level in a positive logic system, or set to low level in a negative logic system), the state holding element passes the input data, and when its clock terminal is negated, the state holding element holds the level of the last input data.

The state holding elements LATCH2 through LATCH5 each include a negative logic clock terminal. Each clock terminal receives, as an input signal, the second clock CLK2 after it passes through a predetermined number of delay units 554 after it is masked using the enable data TGEN. Thus, in a cycle in which the enable data TGEN is asserted, the clock terminal of each state holding element LATCH is set to high level, i.e., is negated. In this state, the state holding element LATCH holds its output.

In contrast, in a cycle in which the enable data TGEN is negated, the clock terminal of each state holding element LATCH is set to low level, i.e., is asserted. In this state, the state holding element LATCH passes the data received from its upstream state holding element.

Accordingly, the number of times a state transition occurs in each of the state holding elements LATCH2 through LATCH5 corresponds to the value of the delay setting data HDT. That is to say, the state holding elements LATCH2 through LATCH5 correspond to the flip-flop group 32 shown in FIG. 2. Furthermore, whether or not a state transition occurs in each of the state holding elements LATCH2 through LATCH5 is determined according to the enable data TGEN.

Figure 7:
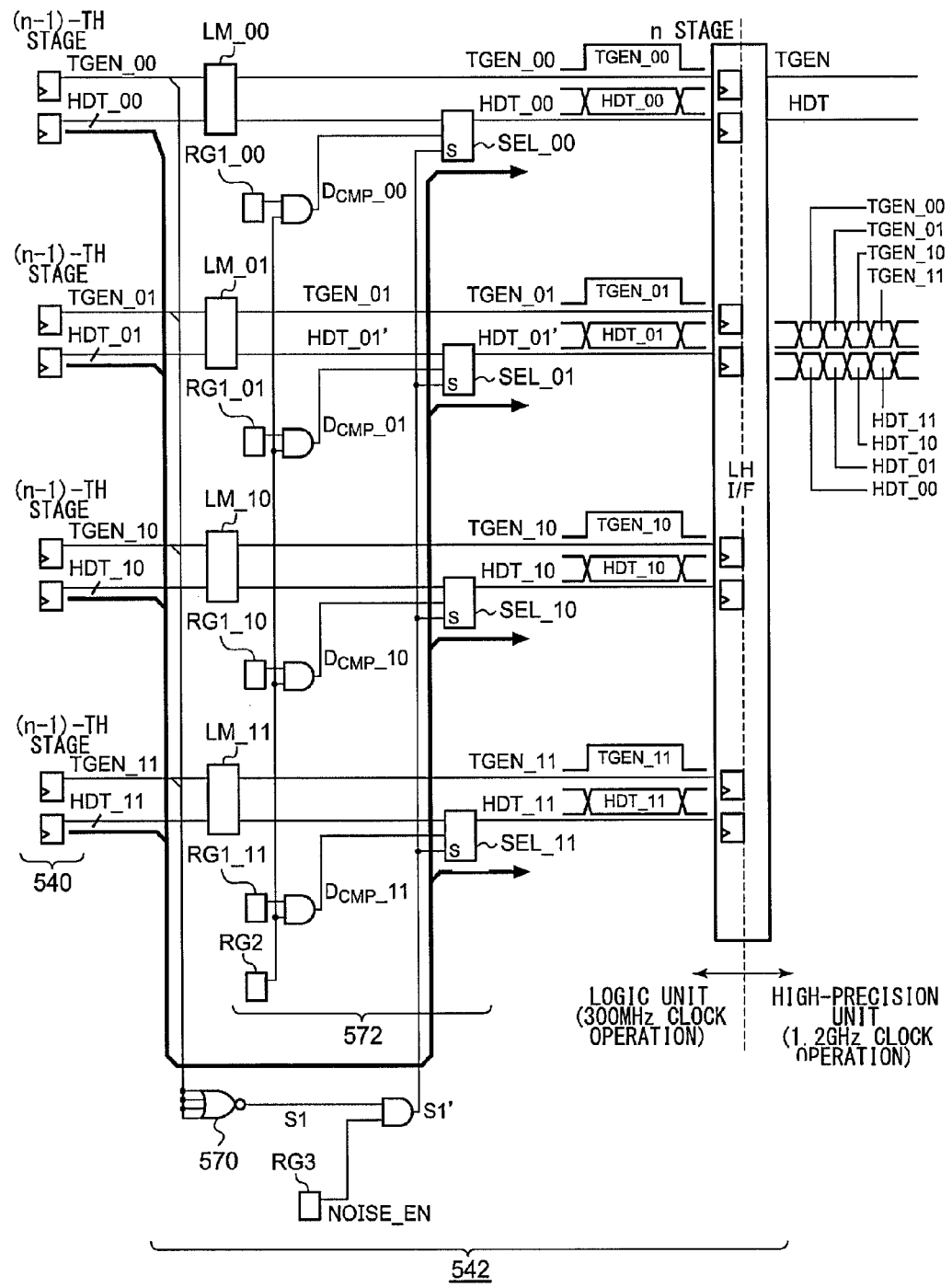
FIG. 7 is a circuit diagram showing a configuration of a current compensation circuit.

FIG. 7 is a circuit diagram showing a configuration of the current compensation circuit 542.

When the N enable data TGEN_00 through TGEN_11 are all negated, the judgment unit 570 asserts the judgment signal S1. The judgment unit 570 includes a NOR gate, for example.

Linearizing memory LM_00, LM_01, LM_10, and LM_11, are each configured as a lookup table, and respectively generate delay setting data HDT_00' through HDT_11' according to the delay setting data HDT_00 through HDT_11 received from the data generating unit 540 arranged as an upstream stage.

A third register RG3 stores control data NOISE_EN used for switching the current compensation on/off. An AND gate 574 generates the logical AND S1' of the judgment data S1 and the control data NOISE_EN.

(i) In a cycle in which the judgment signal S1 is negated, the data replacement unit 572 time-division multiplexes the N enable data TGEN_00 through TGEN_11 and the N delay setting data HDT_00' through HDT_11', and supplies the multiplexed data to the pulse generator 544. Furthermore, (ii) in a cycle in which the judgment signal S1 is asserted, the data replacement unit 572 replaces at least a part of the N delay setting data HDT_00' through HDT_11' with the current compensation data $D_{CMP}$, and time-division multiplexes the N enable data TGEN_00 through TGEN_11 and the data thus subjected to data replacement. The data replacement unit 572 supplies the data thus multiplexed to the pulse generator 544.

A second register RG2 stores the current compensation data $D_{CMP}$ to be used for the data replacement of the delay setting data HDT_00' through HDT_11'. First registers RG1_00, RG1_01, RG1_10, and RG1_11 respectively store machine words which indicate whether or not the delay setting data HDT_00' through HDT_11' for the first phase through the fourth phase are to be replaced.

When the judgment signal S1' is asserted, the selectors SEL_00 through SEL_11 each select the current compensation data $D_{CMP}$. When the judgment signal S1' is negated, the selectors SEL_00 through SEL_11 select the original delay setting data HDT_00' through HDT_11', respectively. Such an arrangement is capable of controlling whether or not the data replacement is performed, according to the value of the judgment signal S1'.

The data replacement unit 572 corresponds to the data replacement unit 24 and the parallel/serial converter 26 shown in FIG. 2.

The above is the configuration of the current compensation circuit 542. With such a semiconductor test apparatus 500, such an arrangement is capable of maintaining the operating current of the pulse generator 544 at a constant level. Thus, such an arrangement is capable of suppressing jitter that can occur in the timing signal St, thereby providing high-precision testing.

Description has been made regarding the present invention with reference to the embodiments. The above-described embodiments have been described for exemplary purposes only, and are by no means intended to be interpreted restrictively. Rather, various modifications may be made by making various combinations of the aforementioned components or processes. Description will be made below regarding such modifications.

Description has been made in the embodiment regarding an arrangement in which the semiconductor device 2 is employed in the timing generator 504 included in the semiconductor test apparatus 500. However, the present invention is not restricted to such an arrangement. Rather, the present invention is applicable to various kinds of circuits that require an operating current to be maintained at a constant level.

In particular, such a logic circuit may have various kinds of configurations so as to change the number of times a state transition occurs according to the input data, i.e., to change the operating current according to the input data, which will be clearly understood by those skilled in this art. The logic circuit may be configured using a combination of logic gates or the like such as AND gates, OR gates, NOR gates, XOR gates, etc., in addition to the latch circuits or flip-flops each configured as a state holding element.

While the preferred embodiments of the present invention have been described using specific terms, such description is for illustrative purposes only, and it is to be understood that changes and variations may be made without departing from the spirit or scope of the appended claims.

What is claimed is:

1. A current compensation circuit configured to receive N parallel data sets for every cycle period of a first clock from a first circuit configured to operate in synchronization with the first clock having a first frequency and to output the N data sets thus received to a second circuit configured as a downstream stage, the current compensation circuit comprising:
    a judgment unit configured to judge, for every cycle period, whether or not the N data sets are effective data which instructs at least one state holding element included in the second circuit to generate an effective state transition; and
    a data replacement unit configured such that, in a cycle period in which judgment has been made that the N data sets are ineffective, at least a part of the N data sets is replaced by current compensation data so as to instruct at least one state holding element included in the second circuit to generate an effective state transition.

2. The current compensation circuit according to claim 1, wherein a parallel/serial converter is arranged between the current compensation circuit and the second circuit, and wherein the second circuit is configured to process, in synchronization with a second clock having a second frequency which is N times the first frequency, the N data sets time-division multiplexed by the parallel/serial converter, and wherein the parallel/serial converter is configured such that (i) in a cycle period in which judgment has been made that the N data sets are effective, the N data sets are time-division multiplexed, and the multiplexed data is supplied to the second circuit, and such that (ii) in a cycle period in which judgment has been made that the N data sets are ineffective, the N data sets are time-division multiplexed after data replacement is performed, and the multiplexed data is supplied to the second circuit.

3. The current compensation circuit according to claim 1, wherein, with the average value of an operating current that flows through at least one state holding element according to the N effective data sets as $I_{DD\_AVE}$, the current compensation data is determined such that a compensation current $I_{CMP}$ that flows through the at least one state element becomes substantially equal to the average value $I_{DD\_AVE}$.

4. The current compensation circuit according to claim 1, wherein, with the average value of the number of times state transitions occur in at least one state holding element included in the second circuit according to the N effective data sets as X, the current compensation data is determined such that the number of times state transitions occur in the state holding elements becomes approximately X.

5. The current compensation circuit according to claim 1, wherein the N data sets each include an enable bit having a correlation with whether or not a state transition occurs in the at least one state holding element, and wherein, when the enable bits of the N data sets are all negated, the judgment unit judges that the N data sets are ineffective.

6. A semiconductor device comprising:
a first circuit configured to operate in synchronization with a first clock having a first frequency, and to generate N parallel data sets for every cycle period of the first clock;
an interface circuit configured to time-division multiplex the N data sets received from the first circuit; and
a second circuit configured to process, in synchronization with a second clock having a second frequency which is N times the first frequency, the N data sets time-division multiplexed by the interface circuit,
wherein the interface circuit comprises:
a judgment unit configured to judge, for every cycle period, whether or not the N data sets are effective data which instructs at least one state holding element included in the second circuit to generate an effective state transition;
a data replacement unit configured such that, in a cycle period in which judgment has been made that the N data sets are ineffective, at least a part of the N data sets is replaced by current compensation data which instructs at least one state holding element included in the second circuit to generate an effective state transition; and
a parallel/serial converter configured such that (i) in a cycle period in which judgment has been made that the N data sets are effective, the N data sets are time-division multiplexed, and the multiplexed data is supplied to the second circuit, and such that (ii) in a cycle period in which judgment has been made that the N data sets are ineffective, the data sets subjected to data replacement are time-division multiplexed, and the multiplexed data is supplied to the second circuit.

7. The semiconductor device circuit according to claim 6, wherein, with the average value of an operating current that flows through at least one state holding element according to the N effective data sets as $I_{DD\_AVE}$, the current compensation data is determined such that a compensation current $I_{CMP}$ that flows through the at least one state element becomes substantially equal to the average value $I_{DD\_AVE}$.

8. The semiconductor device according to claim 6, wherein, with the average value of the number of times state transitions occur in at least one state holding element according to the N effective data sets as X, the current compensation data is determined such that the number of times state transitions occur in the aforementioned at least one state holding element becomes approximately X.

9. The semiconductor device according to claim 6, wherein the N data sets each include an enable bit having a correlation with whether or not a state transition occurs in the at least one state holding element, and wherein, when the enable bits of the N data sets are all negated, the judgment unit judges that the N data sets are ineffective.

10. A timing generator employed in a semiconductor test apparatus, and configured to generate a timing signal having a phase which is adjustable for every predetermined reference period, the timing generator comprising:
a data generating unit configured to output, in a parallel manner in synchronization with a first clock having a period that is N times the reference period, (i) N enable data configured to respectively indicate whether or not the timing signal is to be generated in the N sequential reference periods, and (ii) N delay setting data configured to respectively indicate the phase of the timing signal for the N sequential reference periods;
an interface circuit configured to time-division multiplex the N enable data and the N delay setting data received from the data generating unit; and
a pulse generator configured to receive a set of the enable data and the delay setting data for every reference period, and to apply a delay that corresponds to the delay setting data to a second clock having the same frequency as that of the reference period in the reference period in which the enable data is asserted, so as to generate the timing signal,
wherein the interface circuit comprises:
a judgment unit configured to assert a judgment signal when the N enable data are all negated; and
a data replacement unit configured such that (i) in a cycle in which the judgment signal is negated, the N enable data and the N delay setting data are time-division multiplexed and the multiplexed data is supplied to the pulse generator, and such that (ii) in a cycle in which the judgment signal is asserted, at least a part of the N delay setting data is replaced by current compensation data configured to instruct at least one state holding element included in the pulse generator to generate an effective state transition, the N enable data and the data thus subjected to the data replacement are time-division multiplexed, and the multiplexed data is supplied to the pulse generator.

11. The timing generator according to claim 10, wherein, with the average value of an operating current that flows through the aforementioned at least one state holding element according to the N delay setting data in a cycle in which the judgment signal is asserted as $I_{DD\_AVE}$, the current compensation data is determined such that an amount of a compensation current $I_{CMP}$ that flows through the aforementioned at least one state holding element is substantially equal to the average value $I_{DD\_AVE}$.

12. The timing generator according to claim 10, wherein, with the average value of the number of times state transitions occur in the aforementioned at least one state holding element according to the N delay setting data in a cycle in which the judgment signal is asserted as X, the current compensation data is determined such that the number of times state transitions occur in the aforementioned at least one state holding element according to the current compensation data is approximately X.

13. A test apparatus comprising the timing generator according to claim 10.

* * * * *